United States Patent
Han et al.

(10) Patent No.: US 9,957,363 B2
(45) Date of Patent: *May 1, 2018

(54) METHOD FOR FORMING METAL NANOWIRE OR METAL NANOMESH

(71) Applicants: LG CHEM, LTD., Seoul (KR);
IUCF-HYU (INDUSTRY-UNIVERSITY COOPERATION FOUNDATION HANYANG UNIVERSITY), Seoul (KR)

(72) Inventors: Yang Kyoo Han, Seoul (KR); Je Gwon Lee, Daejeon (KR); Hyun Jin Lee, Daejeon (KR); No Ma Kim, Daejeon (KR); Sung Soo Yoon, Daejeon (KR); Eun Ji Shin, Daejeon (KR)

(73) Assignees: LG CHEM, LTD., Seoul (KR); IUCF-HYU, Seoul (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 14/420,606

(22) PCT Filed: Sep. 5, 2013

(86) PCT No.: PCT/KR2013/008026
§ 371 (c)(1),
(2) Date: Feb. 9, 2015

(87) PCT Pub. No.: WO2014/061915
PCT Pub. Date: Apr. 24, 2014

(65) Prior Publication Data
US 2015/0232628 A1    Aug. 20, 2015

(30) Foreign Application Priority Data
Oct. 19, 2012 (KR) ........................ 10-2012-0116608

(51) Int. Cl.
*C08J 7/12* (2006.01)
*H01B 13/00* (2006.01)
(Continued)

(52) U.S. Cl.
CPC .............. *C08J 7/12* (2013.01); *H01B 13/003* (2013.01); *H01B 13/0016* (2013.01); *H01B 13/0026* (2013.01); *C08J 2333/26* (2013.01)

(58) Field of Classification Search
CPC ....... C08J 7/12; C08J 2333/26; H01B 13/003; H01B 13/0026; H01B 13/0016; B05D 5/00; B05D 5/067
See application file for complete search history.

(56) References Cited

U.S. PATENT DOCUMENTS 9,169,200 B2    10/2015    Han et al.
9,493,588 B2 *  11/2016    Han ...................... G03F 7/0002
(Continued)

FOREIGN PATENT DOCUMENTS

CN    1315937 A    10/2001
CN    101693749 A    4/2010
(Continued)

OTHER PUBLICATIONS

Lee, Graduate School of Hanyang Univ., Thesis, Feb. 2008.*
(Continued)

*Primary Examiner* — James Mellott
(74) *Attorney, Agent, or Firm* — Dentons US LLP

(57) ABSTRACT

The present invention relates to a method for forming a metal nanowire or a metal nanomesh. More particularly, the present invention relates to a method for forming a metal nanowire or a metal nanomesh capable of forming a variety of metal nanowires or metal nanomeshes in a desired shape by a simplified method.

The method for forming a metal nanowire or a metal nanomesh includes the steps of forming a block copolymer
(Continued)

thin film on a substrate, in which the block copolymer thin film includes specific hard segments and soft segments containing one or more polymer repeating units selected from the group consisting of a poly(meth)acrylate-based repeating unit, a polyalkylene oxide-based repeating unit, a polyvinylpyridine-based repeating unit, a polystyrene-based repeating unit, a polydiene-based repeating unit and a polylactone-based repeating unit; conducting orientation of the hard segments and soft segments in a lamellar or cylindrical form in the block copolymer thin film; selectively removing the soft segments; adsorbing a metal precursor onto the hard segments; and removing the hard segments.

9 Claims, 6 Drawing Sheets

(51) Int. Cl.
*B05D 5/00* (2006.01)
*B05D 5/06* (2006.01)

(56) References Cited

U.S. PATENT DOCUMENTS

| | | | | |
|---|---|---|---|---|
| 2002/0010267 | A1* | 1/2002 | Klaerner | C08F 4/00 525/91 |
| 2008/0038467 | A1* | 2/2008 | Jagannathan | B82Y 20/00 427/256 |
| 2009/0087664 | A1* | 4/2009 | Nealey | B81C 1/00031 428/411.1 |
| 2010/0112234 | A1* | 5/2010 | Spatz | B82Y 5/00 427/535 |
| 2013/0105755 | A1* | 5/2013 | Sills | H01L 45/1233 257/2 |
| 2013/0245145 | A1 | 9/2013 | Han et al. | |
| 2015/0228298 | A1 | 8/2015 | Han et al. | |

FOREIGN PATENT DOCUMENTS

| | | |
|---|---|---|
| CN | 101717479 A | 6/2010 |
| CN | 102690490 A | 9/2012 |
| JP | 2005-500229 A | 1/2005 |
| JP | 2012051060 A | 3/2012 |
| JP | 2015-533251 A | 11/2015 |
| KR | 10-2005-0056288 A | 6/2005 |
| KR | 100771886 B1 | 10/2007 |
| KR | 1020080049244 A | 6/2008 |
| KR | 1020100068014 A | 6/2010 |
| KR | 1020100120745 A | 11/2010 |
| KR | 1020100123920 A | 11/2010 |
| KR | 1020100131807 A | 12/2010 |
| KR | 1020110086834 A | 8/2011 |
| KR | 1020110097027 A | 8/2011 |
| KR | 1020110132893 A | 12/2011 |
| KR | 1020120070302 A | 6/2012 |
| KR | 101163659 B1 | 7/2012 |
| KR | 1020120119998 A | 11/2012 |
| WO | 2010/027124 A1 | 3/2010 |
| WO | 2012/057443 A2 | 5/2012 |
| WO | 2012/102286 A1 | 8/2012 |

OTHER PUBLICATIONS

"Using Cylindrical Domains of Block Copolymers to Self-Assemble and Align Metallic Nanowires", Chai et al., ACS NANO vol. 2, 2008, p. 489-501.

"From Nanorings to Nanodots by Patterning with Block Copolymers", Park et al., NANO LETT. vol. 8, 2008, p. 1667-1672.

"Fabrication of Diverse Metallic Nanowire Arrays Based on Block Copolymer Self-Assembly", Jung et al., NANO LETT. vol. 10, 2010, p. 3722-3726.

"Nanowire arrays build themselves", Black, Nature Nanotechnology vol. 2, 2007, p. 464.

"Well-Ordered Thin-Film Nanopore Arrays Formed Using a Block-Copolymer Template**", Jung et al., SMALL vol. 5, 2009, p. 1654-1659.

"Synthesis of New Block Copolymers from n-Butyl Acrylate and DPAA by RAFT Polymerization and Their Properties", Feb. 2008, Lee, Hanyang University.

Q. Shen, et al.: "Fabrication of Silver Nanorods Controlled by a Segmented Copolymer", Journal of Physical , Chemistry, vol. 111, No. 37, Sep. 1, 2007, pp. 13673-13678, XP055231710.

J.G. Lee, et al.: "Long-Range Ordered Self-Assembly of Novel Acrylamide-Based Diblock Copolymers for Nanolithography and Metallic Nanostructure Fabrication", Advanced Materials, vol. 26, 2014, pp. 2894-2900.

M. Kuemmel, et al.: "A Chemical Solution Deposition Route to Nanopatterned Inorganic Material Surfaces", Chem. Mater., vol. 19, Jun. 23, 2007, pp. 3717-3725.

J. K. Lee, et al.: "Synthesis of Novel DPAA Based Block Copolymers by RAFT Polymerization and Their Morphology Control", Abstract for Annual Meeting of the Polymer Society of Korea, 2009.

* cited by examiner

[FIG. 1a]
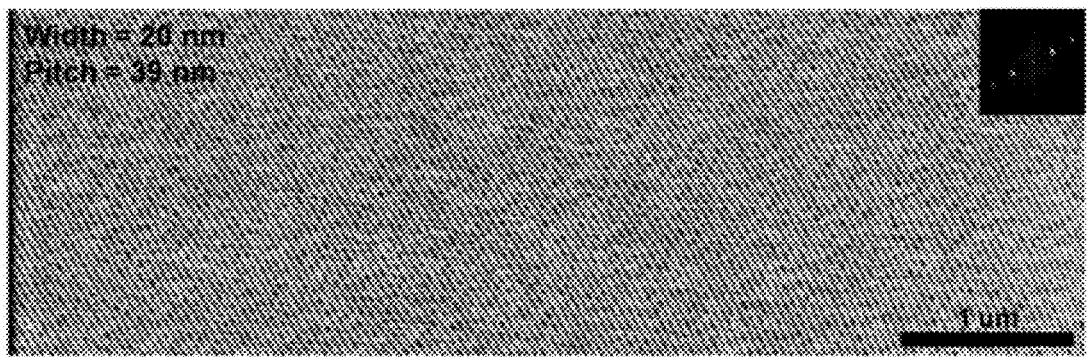
[FIG. 1b]
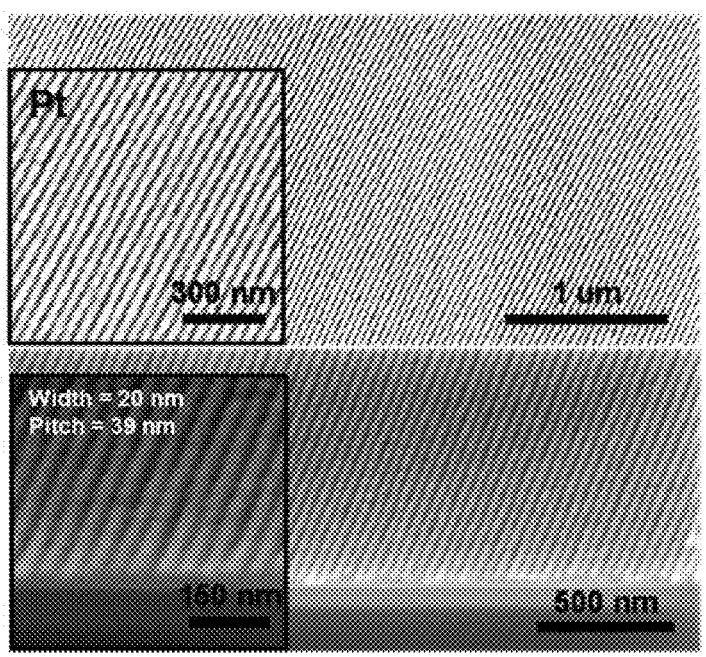

[FIG. 2]
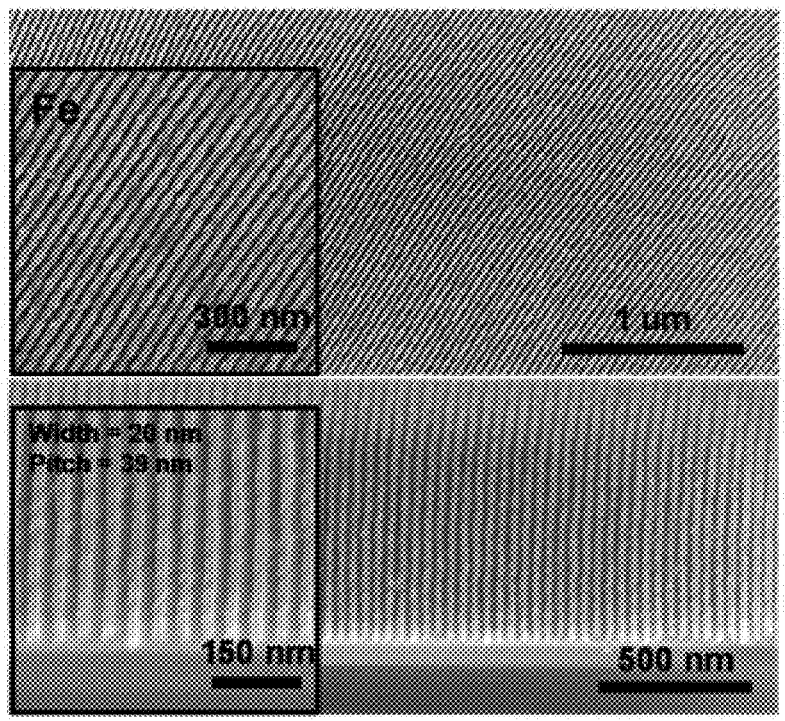
[FIG. 3]
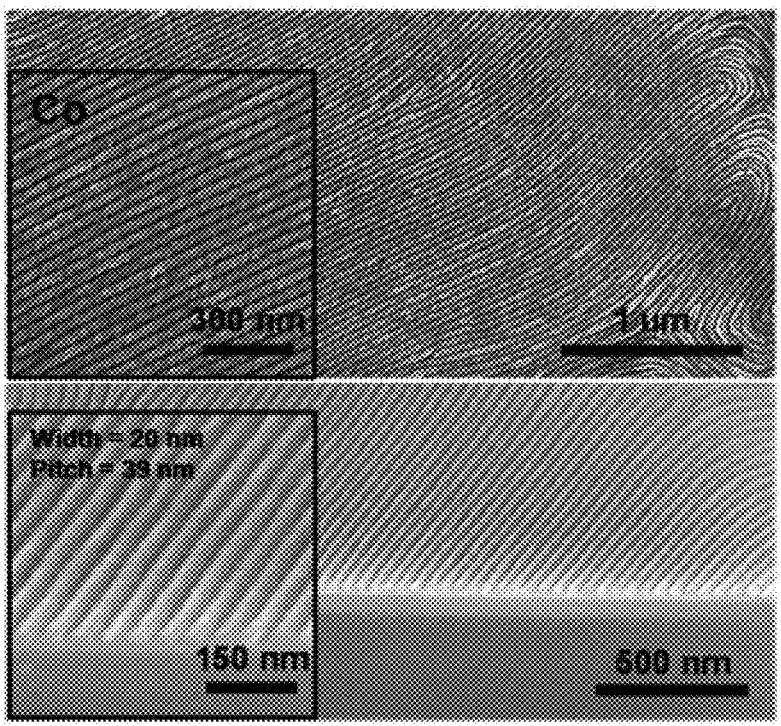

[FIG. 4]
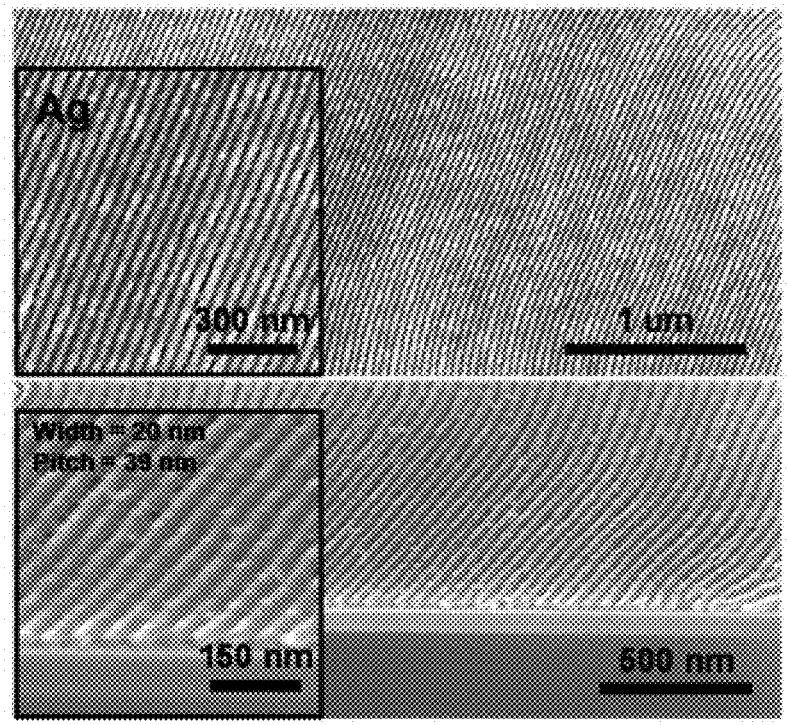
[FIG. 5]
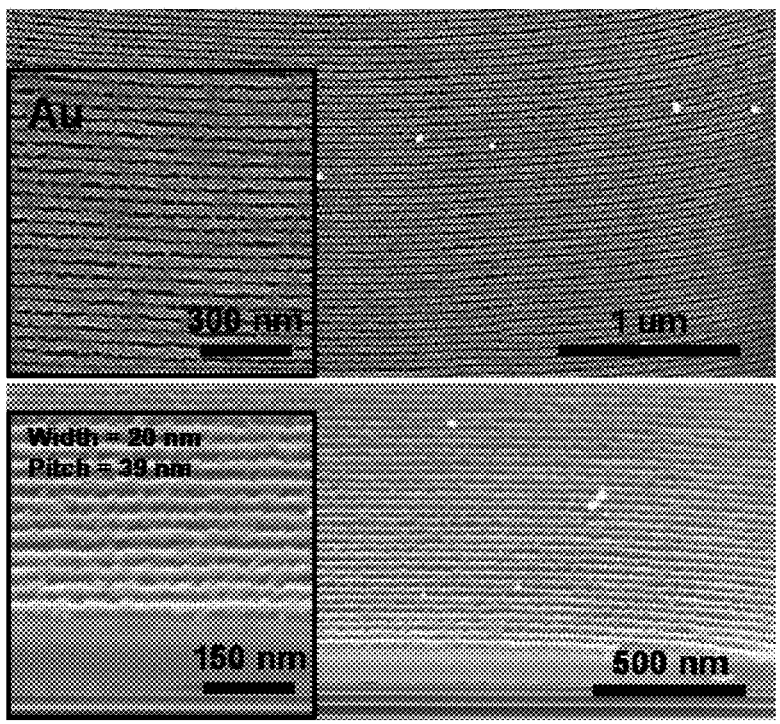

[FIG. 6a]
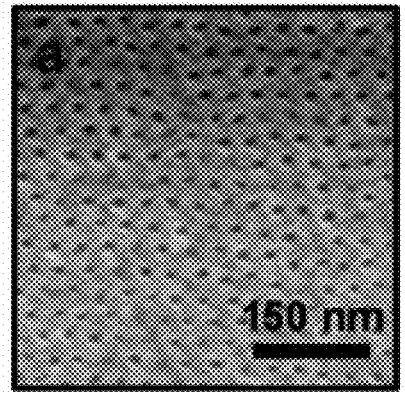
[FIG. 6b]
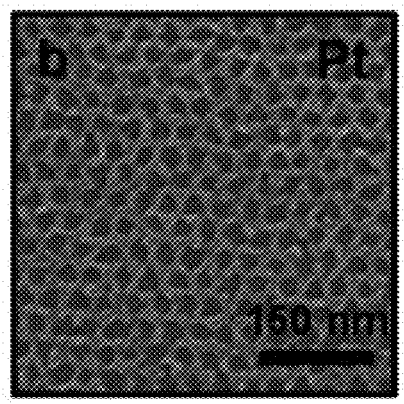
[FIG. 6c]
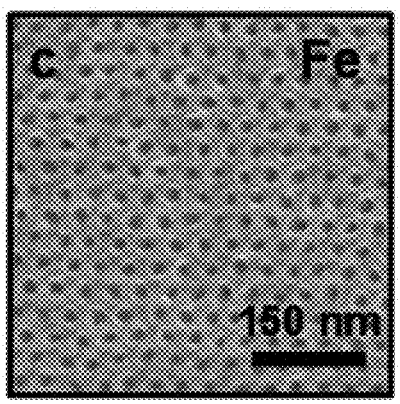

[FIG. 6d]
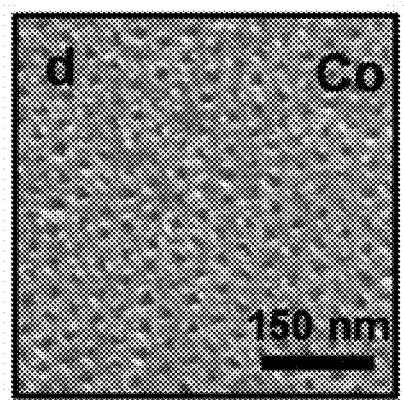
[FIG. 6e]
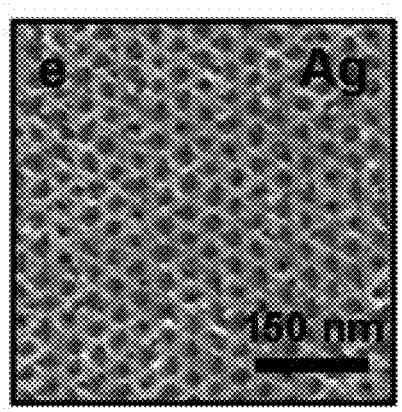

[FIG. 7]
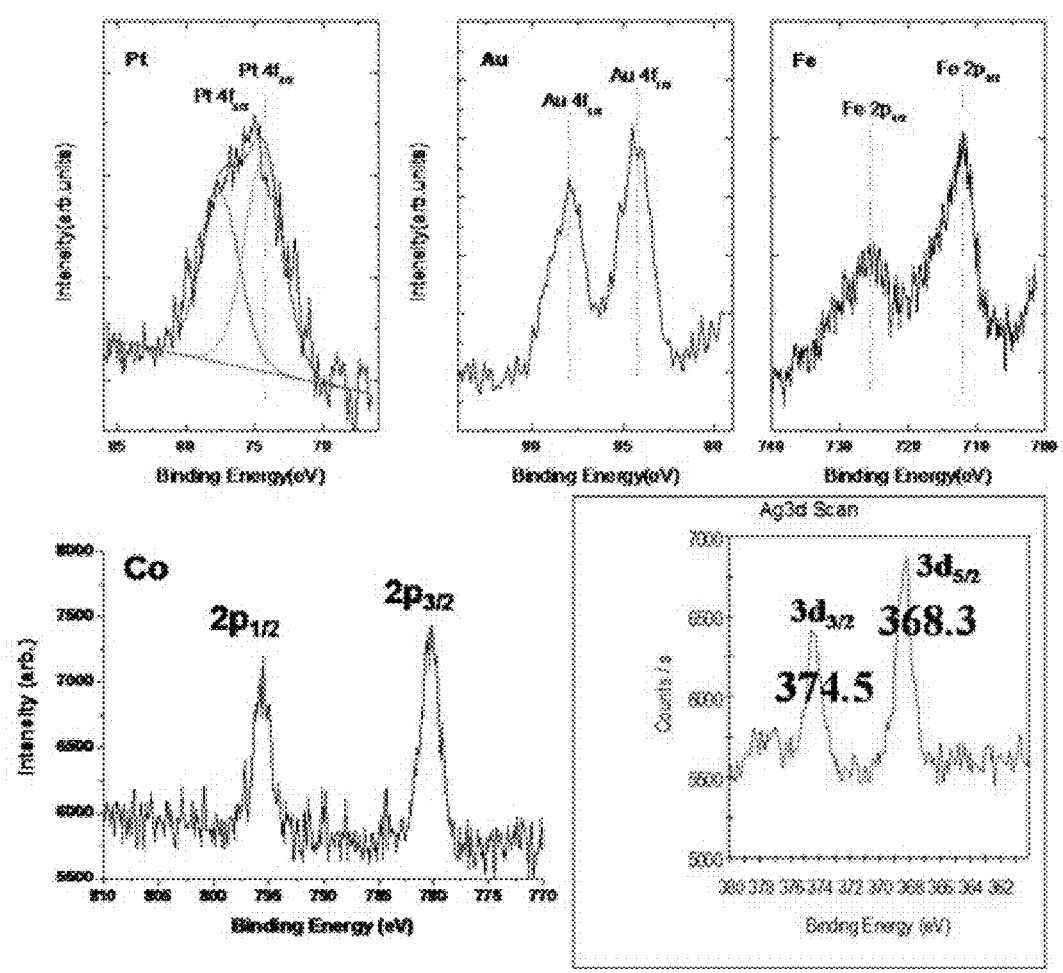

METHOD FOR FORMING METAL NANOWIRE OR METAL NANOMESH

This application is a National Stage Application of International Application No. PCT/KR2013/008026, filed Sep. 5, 2013, and claims the benefit of Korean Application No. 10-2012-0116608 filed on Oct. 19, 2012, all of which are hereby incorporated by reference in their entirety for all purposes as if fully set forth herein.

TECHNICAL FIELD

The present invention relates to a method for forming a metal nanowire or a metal nanomesh. More particularly, the present invention relates to a method for forming a metal nanowire or a metal nanomesh capable of forming a variety of metal nanowires or metal nanomeshes in a desired shape by a simplified method.

BACKGROUND

With the rapid progress of nano scientific technology, an inorganic nanostructure such as a one-dimensional metal nanowire structure, etc. has received much attention because it is applicable to the fields such as an optical device, an optical waveguide, a biosensor, a magnetic storage medium, etc. In general, this nanowire is known to be directly synthesized by a vapor-liquid-solid (VLS) growth method. Growth rate of the synthesized nanowire can be estimated according to the kind of the catalyst material and the size of catalyst droplet used in this method. However, the VLS method has limitations in the scale (length, width, etc.), properties, or composition of the synthesizable nanowire, and has a disadvantage that it is difficult to grow a nanowire in the exact position. Accordingly, there is a continuous demand for a method of obtaining a nanowire by easily controlling the scale, properties, or composition of the nanowire.

Meanwhile, formation of a nanostructure through self-assembly of a block copolymer is a simple process and thus requires a low production cost. The chemical structure of the material is similar to the photoresist currently used, and thus there is an advantage that it can be easily applied to a semiconductor manufacturing process. The block copolymer includes polymer blocks having different chemical structures, connected through a covalent bond, and according to the compositions of blocks constituting the block copolymer, the length of the chain, and Flory-Huggins interaction parameter, it may form various nanostructures including a complicated three-dimensional structure such as a gyroid, or a HPL (hexagonal perforated lamellae) structure, as well as a basic structure such as a sphere, a cylinder, or a lamellae. Also, the size of the nanostructure may be controlled from 5 to 50 nm, according to chemical structure of the block copolymer, compositional ratio of blocks, the molecular weight thereof, etc. It has attracted much attention as a next-generation technology of forming nanostructures, because of applicability of a non-destructive process, simple production of a template for high density arrangement of nanostructures, etc.

Accordingly, recent basic studies have been actively conducted to form a variety of metal nanowires, nanomeshes, nanorings, etc. using the nanostructure of the block copolymer as a template or a reactive group. For example, Buriak's group has proposed that a cylindrical nanostructure of a polystyrene-b-poly(2-vinylpyridine) (PS-b-P2VP) block copolymer is regularly arranged in a topographic pattern having a width of several hundred nanometers or more, and then used for forming a metal nanowire. In this method, the P2VP blocks present inside the cylindrical structure thus arranged are allowed to be positively charged by acid treatment, and then negatively charged metal chloride ions are adsorbed onto the inside surface of the cylindrical structure by electrostatic attraction, and then only the block copolymers are selectively removed by plasma treatment so as to selectively form a regularly arranged metal nanowire on the surface of silicon substrate [*Nature Nanotechnology* 2007, 2, 464; *Acs Nano* 2008, 2, 489]. Meanwhile, Ross' group has manufactured a variety of metal (Ti, W, Pt, Co, Ni, Ta, Au, Al) nanowires by forming a horizontally arranged poly(styrene-b-dimethylsiloxane) (PS-b-PDMS) cylinder by solvent annealing and then conducting reactive ion etching using the same as a template [*Nano Lett.* 2010, 10, 3722].

Further, a method for forming a variety of metal nanomeshes by conducting a reverse pattern transfer process using a spherical nanostructure formed from the PS-b-PDMS block copolymer as a template was also proposed [*Small* 2009, 5, 1654]. In addition, Russell's group has manufactured a metal nanoring, etc. by forming an oriented poly(styrene-b-4-vinylpyridine) (PS-b-P4VP) thin film vertical to a substrate by solvent annealing, forming a porous nanostructure by surface reconstruction, and then depositing gold onto the nano-scale porous nanostructure, followed by heat treatment [*Nano Lett.* 2008, 6, 1667].

However, in the above described conventional methods for forming a nanowire or nanomesh from a block copolymer, an acid aqueous solution was mainly used for adsorption of the metal precursor onto the block copolymer. For this reason, the kind of the adsorbable metal precursors and the kind of the applicable metals are restricted, for example, formation of silver (Ag) nanowires or nanomeshes was impossible. Moreover, an additional chemical or physical process such as surface treatment, middle layer coating, metal deposition, etc. is needed before the adsorption process of the metal precursor. Accordingly, there was also a disadvantage that the overall production process of the nanowire or nanomesh becomes complicated.

SUMMARY OF THE INVENTION

The present invention provides a method for forming a metal nanowire or a metal nanomesh capable of forming a variety of metal nanowires or metal nanomeshes in a desired shape by a simplified method.

The present invention provides a method for forming a metal nanowire or a metal nanomesh, including the steps of forming a block copolymer thin film on a substrate, in which the block copolymer thin film includes hard segments containing a repeating unit of the following Chemical Formula 1 and soft segments containing one or more polymer repeating units selected from the group consisting of a poly(meth)acrylate-based repeating unit, a polyalkylene oxide-based repeating unit, a polyvinylpyridine-based repeating unit, a polystyrene-based repeating unit, a polydiene-based repeating unit and a polylactone-based repeating unit; conducting orientation of the hard segments and soft segments in a lamellar and cylindrical form in the block copolymer thin film; selectively removing the soft segments; adsorbing a metal precursor onto the hard segments; and removing the hard segments:

[Chemical Formula 1]

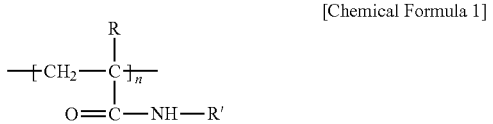

wherein n is an integer of 5 to 600, R is hydrogen or methyl, R' is X,

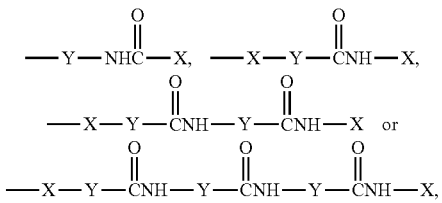

X is —Z—R", Y is alkylene having 1 to 10 carbon atoms, Z is arylene having 6 to 20 carbon atoms 6 to 20, R" is a linear or branched hydrocarbon having 10 to 20 carbon atoms, or a linear or branched perfluorohydrocarbon having 10 to 20 carbon atoms.

DETAILED DESCRIPTION OF THE EMBODIMENTS

Hereinafter, a method for forming a metal nanowire or a metal nanomesh according to specific embodiments of the present invention will be described in detail.

According to one embodiment of the present invention, provided is a method for forming a metal nanowire or a metal nanomesh, including the steps of forming a block copolymer thin film on a substrate, in which the block copolymer thin film includes hard segments containing a repeating unit of the following Chemical Formula 1 and soft segments containing one or more polymer repeating units selected from the group consisting of a poly(meth)acrylate-based repeating unit, a polyalkylene oxide-based repeating unit, a polyvinylpyridine-based repeating unit, a polystyrene-based repeating unit, a polydiene-based repeating unit and a polylactone-based repeating unit; conducting orientation of the hard segments and soft segments in a lamellar and cylindrical form in the block copolymer thin film; selectively removing the soft segments; adsorbing a metal precursor onto the hard segments; and removing the hard segments.

The present inventors synthesized a novel block copolymer by sequentially polymerizing specific (meth)acrylate-based monomers and acrylamide-based monomers through RAFT polymerization which is known as a living radical polymerization method, and they demonstrated its characteristics. They had applied it for a patent, provided with Korean Patent Application No. 2012-0027392.

Meanwhile, the results of continuous experiments of the present inventors showed that a metal nanowire or metal nanomesh can be very easily formed in a desired shape by block copolymer lithography using this novel block copolymer thin film. In addition, in the structure of the novel block copolymer, although the soft segment is a polyalkylene oxide-based repeating unit, a polyvinylpyridine-based repeating unit, a polystyrene-based repeating unit, a polydiene-based repeating unit or a polylactone-based repeating unit, the metal nanowire or metal nanomesh could be easily formed.

More specifically, according to one embodiment, a metal nanowire or metal nanomesh can be formed by a simplified method of applying solvent annealing or heat treatment of the block copolymer thin film to allow orientation of each of the segments in a lamellar or cylindrical form, selectively removing the soft segments, adsorbing a metal precursor onto the remaining hard segments, and removing the hard segments. At this time, the specific shape or scale of each segment oriented in a lamellar and cylindrical form can be easily adjusted in a desired shape by controlling the molecular weight or the content range of each segment, or the orientation conditions in the block copolymer, thereby forming a metal nanowire or metal nanomesh having a desired shape or scale therefrom.

Moreover, it was confirmed that in the formation method of one embodiment, an additional chemical or physical treatment process such as surface treatment of the block copolymer thin film, middle layer coating, metal deposition, etc. is not needed before the adsorption process of the metal precursor, and the process of removing the hard segments after adsorption of the metal precursor onto the hard segments is only conducted to form the metal nanowire or metal nanomesh by a simplified process.

Additionally, in the formation method of one embodiment, a neutral metal salt aqueous solution can be used as a metal precursor, instead of the acidic aqueous solution conventionally used, owing to use of the specific block copolymer containing the repeating unit of Chemical Formula 1, etc. Therefore, the kind of the metal precursor and the metal component applicable to the formation method of one embodiment can be more diversified, and in particular, a silver metal nanowire or nanomesh which could not be formed by the conventional method using the block copolymer can be formed properly using a silver (Ag) precursor.

Consequently, according to the formation method of one embodiment, a variety of metal nanowires or metal nanomeshes can be formed in a desired shape by a simplified method, and preferably applied to an optical device, a biosensor, a magnetic storage medium, or next-generation device or electrode, etc.

As described above, it is likely that formation of the metal nanowire or metal nanomesh from the polymer thin film on which each of the segments is oriented in a lamellar and cylindrical form by using the block copolymer arises from self-assembling behavior of the acrylamide-based polymer block of Chemical Formula 1 constituting the hard segment and microphase separation from the soft segments. Hereinafter, the technical cause will be explained in more detail.

A polymer block constituting the hard segment (i.e., repeating unit of Chemical Formula 1) may be obtained by polymerization of specific acrylamide-based monomers, to be explained later. The acrylamide-based monomer has a chemical structure that contains a self-assembling non-polar aliphatic hydrocarbon (having more than 10 carbon atoms), an arylene group causing π-π orbital interactions and an amide group causing intermolecular or intramolecular hydrogen bonding. Through the self-assembling behavior of the long-chain aliphatic hydrocarbon, π-π orbital interactions of the arylene groups and intramolecular hydrogen bonding of the amide groups, the monomer may form a regular crystal structure in the solid state.

Thus, if a polymerization of the monomers is conducted, polymerization occurs while the monomer molecules are well-oriented, and therefore, the individual monomer molecules are regularly arranged in the polymer chain. More specifically, the monomer molecules well-oriented through the polymerization combine together to form one polymer chain (i.e., one polymer building block), and these polymer building blocks aggregate to form a regularly arranged polymer. Due to the regular arrangement of the polymer building blocks in the polymer, the polymer block of the hard segment (i.e., repeating unit of Chemical Formula 1) may manifest self-assembling property, which defines a plurality of spaces having uniform size, after polymerization.

Meanwhile, the block copolymer is prepared by polymerization of the acrylamide-based monomers, after forming polymer blocks constituting the soft segments by polymerization of the specific monomers. Thus, if polymerization of the acrylamide-based monomers is conducted, the plurality of spaces is defined by the hard segments and self-assembling property of the monomer constituting the hard segment, and the polymer blocks of the hard segments are regularly spontaneously arranged at the ends of the soft segments, thereby forming the above explained block copolymer. It is considered that the regular arrangement of the hard segment polymer blocks arises from self-assembling behavior of the crystalline hard segment, and micro-phase separation between both segments.

As a result, in the block copolymer and a thin film obtained by solvent annealing or heat treatment thereof, a nanostructure or nanopattern may be formed, for example, in which the hard segments containing the repeating unit of Chemical Formula 1 and the soft segments having different properties are regularly arranged in a lamellar and cylindrical form due to phase separation. By controlling the treatment conditions of the solvent annealing or heat treatment, or the molecular weight or content range of each segment in the block copolymer, the block copolymer and the thin film thereof may have a nanostructure or a nanopattern in which the cylindrical forms are regularly arranged in a square array or hexagonal array, or the cylindrical or lamellar form are controlled in the desired shape and scale. The regular nanostructure or nanopatterns may be identified through AFM (atomic force microscopy) or SEM (scanning electron microscopy) analysis of the block copolymer thin film, etc.

Therefore, when the soft segments are selectively removed from the block copolymer thin film on which the nanostructure or nanopattern is formed, the metal precursors are adsorbed onto the remaining hard segments, and then the hard segments are removed, the metal nanowire or metal nanomesh can be formed in a desired shape or scale by the metal components formed according to the nanostructure such as the cylindrical or lamellar form defined by the hard segments.

Further, according to the formation method of one embodiment, the lamellar or cylindrical hard segment nanostructure having a shape and scale corresponding to the final desired nanowire or nanomesh can be easily formed by controlling the process conditions or the kind of the treatment material for removing the soft segments, or adsorption of metal oxide onto the thin film from which the soft segments are removed, the kind, concentration or treatment time of the material to be adsorbed, etc. Therefore, according to the formation method of one embodiment, the nanostructure of the hard segment thus obtained is used so as to more easily form a metal nanowire or metal nanomesh having the final desired shape and scale.

Meanwhile, the above described method for forming the metal nanowire or metal nanomesh according to one embodiment of the present invention will be described in more detail below. First, the block copolymer used in the method of one embodiment will be described in more detail, and then each step of the process of forming the metal nanowire or metal nanomesh using the same will be described.

The block copolymer used in the method of one embodiment includes a hard segment containing a repeating unit of Chemical Formula 1. In the repeating unit of Chemical Formula 1, Z may be any arylene having 6 to 20 carbon atoms, and specific examples thereof may include

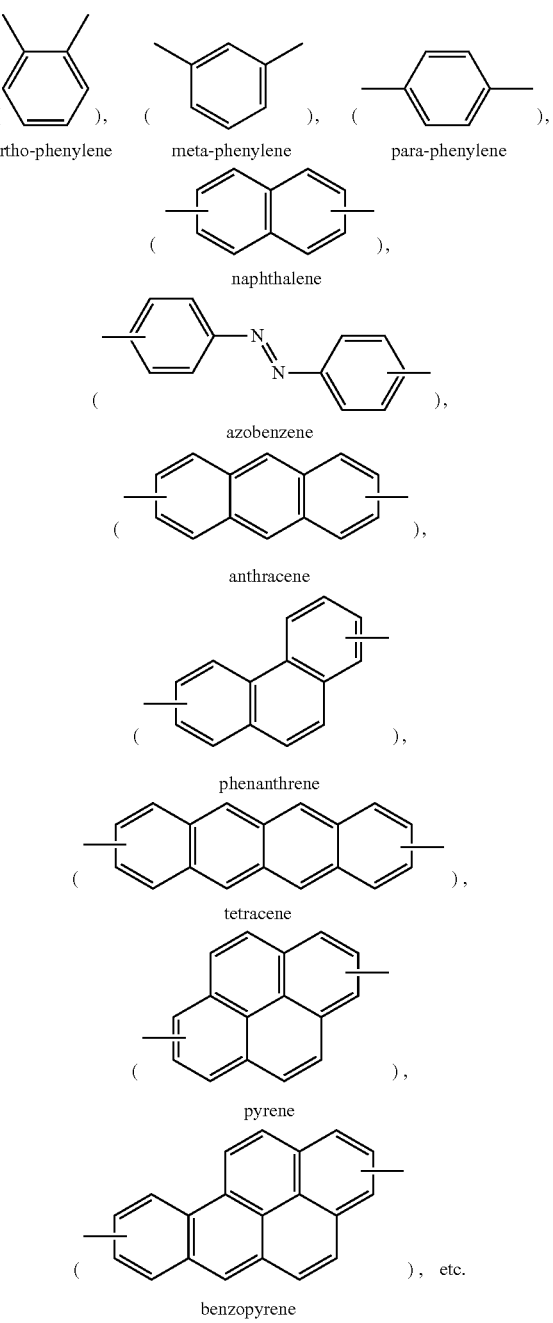

Further, R" may be a linear or branched aliphatic hydrocarbon substituted at the ortho-, meta- or para-position of the aromatic ring in Z, and the hydrocarbon may have a long chain containing at least 10 carbon atoms, more specifically, 10 to 20 carbon atoms. Also, the hydrocarbon of R" may be substituted with fluorine atom, and R″ may be a linear or branched perfluorohydrocarbon having 10 to 20 carbon atoms.

As the repeating unit of Chemical Formula 1 and the monomer of the following Chemical Formula 4 have a long chain hydrocarbon and arylene, self-assembling property of the hard segment or the monomers may be remarkably manifested, and as a result, a nanostructure may be formed in a cylindrical or lamellar form in which the crystalline hard segment and soft segment are regularly arranged in a square or hexagonal shape by micro-phase separation.

The hard segment may include only one kind of the repeating unit belonging to Chemical Formula 1, or it may include a copolymer-type repeating unit by including two or more kinds of the repeating unit belonging to Chemical Formula 1.

Further, the block copolymer used in the method of one embodiment includes a soft segment together with the above described hard segment, and the soft segment may include a poly(meth)acrylate-based repeating unit, a polyalkylene oxide-based repeating unit, a polyvinylpyridine-based repeating unit, a polystyrene-based repeating unit, a polydiene-based repeating unit or a polylactone-based repeating unit of the following Chemical Formula 2.

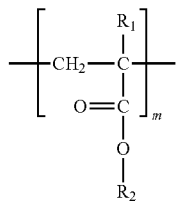

[Chemical Formula 2]

wherein m is an integer of 30 to 1000, $R_1$ is hydrogen or methyl and $R_2$ is alkyl having 1 to 20 carbon atoms.

Each of the polymer repeating units of the soft segment may be derived from a monomer typically used for forming each of the polymers. For example, the poly(meth)acrylate-based repeating unit may be a poly[$C_1$~$C_{10}$ alkyl(meth)acrylate] repeating unit derived from a $C_1$~$C_{10}$ alkyl(meth)acrylate-based monomer, and specific examples thereof may include those derived from methyl acrylate (MA), methyl methacrylate (MMA), ethyl acrylate (EA), ethyl methacrylate (EMA), n-octyl acrylate (OA), etc. Further, the polyalkylene oxide-based repeating unit may be derived from an alkylene oxide-based monomer, and a specific example thereof may be a polyethylene oxide repeating unit derived from ethylene oxide. The polyvinylpyridine-based repeating unit may be derived from a vinylpyridine-based monomer, and a specific example thereof may be a poly(2-vinylpyridine) repeating unit or a poly(4-vinylpyridine) repeating unit derived from 2-vinylpyridine or 4-vinylpyridine. Further, the polystyrene-based repeating unit may be derived from a monomer such as substituted or unsubstituted styrene, etc., and the polydiene-based repeating unit may be derived from a conjugate diene-based monomer, etc. Examples of the polydiene-based repeating unit may include a polybutadiene repeating unit derived from butadiene or a polyisoprene repeating unit derived from isoprene. Further, the polylactone-based repeating unit may be a polymer repeating unit such as a polylactide repeating unit or a polyepsilon-caprolactone repeating unit, for example, derived from a monomer such as lactide or epsilon-caprolactone, etc.

Further, the soft segment may include only one kind of a repeating unit derived from a single monomer, or it may include a copolymer repeating unit derived from two or more kinds of monomers, i.e., two or more kinds of repeating units.

Furthermore, the block copolymer may have a number average molecular weight of about 5,000 to 200,000, or about 10,000 to 100,000. Further, the block copolymer may include about 10 to 90 wt %, or about 20 to 80 wt % of the hard segments, and about 90 to 10 wt %, or about 80 to 20 wt % of the soft segments.

As the block copolymer satisfies the above molecular weight characteristic and the content range of each segment, a block copolymer thin film including a regular cylindrical or lamellar nanostructure may be formed by solvent annealing or heat treatment of the block copolymer. Further, the specific shape or scale of the nanostructure can be easily controlled by controlling the molecular weight of the block copolymer and/or the molecular weight or content range of each segment, and therefore, a final desired metal nanowire or metal nanomesh having a specific shape and scale can be easily obtained therefrom.

Further, the hard segment and the block copolymer including the same may have a melting point ($T_m$) of about 200 to 300° C. or about 220 to 280° C. Further, the soft segment may have a glass transition temperature ($T_g$) of about 40 to 130° C. or about 95 to 120° C. As the hard segment and the soft segment have the melting point and the glass transition temperature within the above range, a block copolymer thin film including a regular cylindrical or lamellar nanostructure may be more preferably formed.

Meanwhile, the above described block copolymer may be prepared by a preparation method, including the steps of conducting polymerization of the above described specific monomers to obtain a polymer corresponding to the soft segment, and then conducting RAFT polymerization of a reactant containing one or more of the monomer of Chemical Formula 4, in the presence of the resulting polymerization product. However, the method for obtaining the polymer corresponding to the soft segment and the conditions thereof may be conducted in accordance with the method and conditions typically known to those skilled in the art, and hereafter, descriptions thereof will be made with reference to a soft segment containing a poly(meth)acrylate-based repeating unit.

According to one example of the preparation method, the block copolymer may be prepared by a preparation method including the steps of conducting RAFT polymerization of a reactant containing one or more of (meth)acrylate-based monomer of Chemical Formula 3, in the presence of a radical initiator and a RAFT reagent, so as to form a polymerization product having a repeating unit of Chemical Formula 2; and conducting RAFT polymerization of a reactant containing one or more of the monomer of Chemical Formula 4, in the presence of the resulting polymerization product:

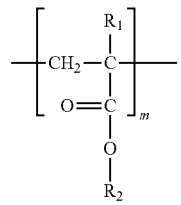

[Chemical Formula 2]

in Chemical Formula 2, m is an integer of 30 to 1000, $R_1$ is hydrogen or methyl, and $R_2$ is alkyl having 1 to 20 carbon atoms.

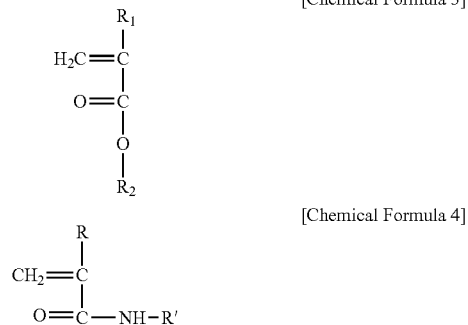

[Chemical Formula 3]

[Chemical Formula 4]

in Chemical Formulae 3 and 4, $R_1$, $R_2$, R and R' are the same as defined in Chemical Formulae 1 and 2.

As described, the block copolymer used in the method of one embodiment may be easily prepared by conducting polymerization of the specific monomers to form polymer blocks constituting the soft segments, and conducting RAFT polymerization of the acrylamide-based monomers of Chemical Formula 4 in the presence of the resulting polymer blocks to form polymer blocks constituting the hard segments. That is, if the first polymerization is conducted, a polymer corresponding to the soft segment such as a polymer of the monomer of Chemical Formula 3 is formed. A polymerization may occur by the chain transferring group bound to the end of this polymer. Therefore, if RAFT polymerization of the monomers of the Chemical Formula 4 is conducted using this polymer as a macroinitiator, the monomers of the Chemical Formula 4 may be polymerized from the end of the macroinitiator. As a result, a block copolymer including the above described hard segment and soft segment may be prepared.

The prepared block copolymer and the thin film including the same may exhibit a property that the hard segments are regularly arranged in a cylindrical or lamellar form by phase separation from the soft segments due to the self-assembling property of the block copolymer. Therefore, a block copolymer thin film, in which the cylindrical forms are regularly arranged in a square or hexagonal shape or arranged in a lamellar form, may be manufactured using the block copolymer, and the metal nanowire or metal nanomesh can be formed using the resulting thin film according to the formation method of one embodiment.

Each step of the above described preparation method of the block copolymer will be described in more detail.

First, in the preparation method, the type of the monomer which can be used in the first polymerization step was previously described, and thus a detailed description thereof will be omitted.

As the monomer of Chemical Formula 4, any monomer satisfying the structure of Chemical Formula 4 may be used, specific examples thereof may include N-(para-dodecyl)phenyl acrylamide (DOPAM), N-(para-tetradecyl)phenyl acrylamide (TEPAM), N-(para-hexadecyl)phenyl acrylamide (HEPAM), N-(para-dodecyl)naphthyl acrylamide (DONAM), N-(para-tetradecyl)naphthyl acrylamide (TENAM), N-(para-hexadecyl)naphthyl acrylamide (HENAM), N-(para-dodecyl)azobenzenyl acrylamide (DOAZAM), N-(para-tetradecyl)azobenzenyl acrylamide (TEAZAM), N-(para-hexadecyl)azobenzenyl acrylamide (HEAZAM), N-[4-(3-(5-(4-dodecyl-phenylcarbamoyl)pentyl-carbamoyl)-propyl)phenyl acrylamide (DOPPPAM), or the like, and two or more monomers selected therefrom may be used.

As these monomers, those described in Korean Patent Application No. 2011-0087290 (Korean Patent No. 1163659) of the present inventors may be used. The monomer of Chemical Formula 4 and the preparation method thereof are described in Korean Patent Application No. 2011-0087290 (Korean Patent No. 1163659) of the present inventors, which are apparent to those skilled in the art.

Meanwhile, in the preparation method of the block copolymer, monomers for formation of the soft segments may be polymerized before polymerization of the monomers of Chemical Formula 4. For example, RAFT polymerization of a reactant containing one or more of the (meth)acrylate-based monomer of Chemical Formula 3 may be conducted in the presence of the radical initiator and the RAFT reagent. As a result, a kind of a macroinitiator may be obtained, in which the RAFT reagent is bound to both ends of the (meth)acrylate-based polymer of the monomers of Chemical Formula 3.

At this time, the radical initiator, RAFT reagent, monomer of Chemical Formula 3, or the like may be prepared as a reaction solution by dissolving it in an organic solvent, and the RAFT polymerization process may be conducted in the reaction solution state. The organic solvent may include one or more halogen-based or aromatic solvents selected from the group consisting of methylenechloride, 1,2-dichloroethane, chlorobenzene, dichlorobenzene, benzene, toluene, etc., or one or two or more kinds of a polar solvent selected from the group consisting of acetone, chloroform, tetrahydrofurane (THF), dioxane, monoglyme, diglyme, dimethylformamide (DMF), dimethylsulfoxide (DMSO), dimethylacetamide (DMAC), etc. The organic solvent may be used in an amount of about 2 to 10 times of the weight of the monomer of the Chemical Formula 3. The organic solvent may also be used as a reaction medium in the RAFT polymerization of the monomer of Chemical Formula 4, to be described later.

As the radical initiator, any initiators known to be usable in radical polymerization may be used without specific limitations. Specific examples of the radical initiator may include azobisisobutyronitrile (AIBN), 2,2'-azobis-(2,4-dimethylvaleronitrile, benzoyl peroxide (BPO), di-t-butyl peroxide (DTBP), etc., and two or more kinds thereof may be used. The radical initiator may be also used in the polymerization of the monomer of Chemical Formula 4, to be described later.

The RAFT reagent may include a thermal decomposition initiator such as S-1-dodecyl-S'-(α,α'-dimethyl-α"-acetic acid)trithiocarbonate, cyanoisopropyl dithiobenzoate, cumyl thiobenzoate, cumyl phenylthioacetate, 1-phenylethyl-1-phenyldithioacetate, 4-cyano-4-(thiobenzoylthio)-N-succinimide valerate, or the like, and a mixture of two or more thereof may be used.

The RAFT reagent may be used in the ratio of about 0.001 to 5.0 mol % of the weight of the monomer of Chemical Formula 3, and the radical initiator may be used in the mole equivalent of about 0.1 to 1.0 of the RAFT reagent. Using the radical initiator and RAFT reagent in the above contents, RAFT polymerization may be effectively conducted.

If the above described RAFT polymerization is conducted, a kind of a macroinitiator may be obtained in which the RAFT reagent is bound to both ends of the (metha)acrylate-based polymer of the monomer of Chemical Formula 3. This macroinitiator may have a molecular weight corresponding to that of the soft segment of the final block copolymer.

Meanwhile, in another embodiment, the first polymerization step may be conducted by a method of polymerizing alkylene oxide-based monomers in the presence of an acidic or basic catalyst to form a polyalkylene oxide-based polymer, or polymerizing lactide or epsilon-caprolactone in the presence of a metal catalyst to form a polylactone-based polymer. Further, the first polymerization step may be conducted by polymerizing monomers such as vinylpyridine-based monomer, substituted or unsubstituted styrene, butadiene, isoprene, etc. by a typical method. Finally, the polymer corresponding to the soft segment may be obtained.

After the above described first polymerization step, RAFT polymerization of the monomer of Chemical Formula 4 is conducted in the presence of the resulting polymerization product and a radical initiator. The RAFT polymerization may be conducted using the same kinds and amounts of the radical initiator and organic solvent as used in the first polymerization step, except that the polymerization is conducted in the presence of the above described macroinitiator as the product of the first polymerization step, instead of the RAFT reagent. As the result, the monomer of Chemical Formula 4 are polymerized to form a hard segment, and the hard segment is bound to both ends of the macroinitiator to prepare the block copolymer used in the method of one embodiment. For example, after the RAFT polymerization of Chemical Formula 3, the macroinitaitor, the radical initiator, the monomers of Chemical Formula 4, and an organic solvent are homogeneously mixed to form a solution, oxygen is removed from the solution under nitrogen atmosphere, and then RAFT polymerization of the monomer of Chemical Formula 4 may be conducted.

In the above described preparation method, each polymerization process may be conducted at a reaction temperature of about 30 to 140° C., or 60 to 130° C. for about 30 to 200 hours or about 50 to 170 hours.

After conducting the RAFT polymerization of the monomer of Chemical Formula 4, a step of precipitating the resulting polymerization product in a non-solvent may be further conducted. As a result, the above described block copolymer may be obtained with high purity. As the non-solvent, any solvent that does not dissolve the above described polymerization product (for example, polymer corresponding to each segment and block copolymer) may be used. Specific examples of the non-solvent may include a polar solvent such as methanol, ethanol, normal propanol, isopropanol, or ethylene glycol, or a non-polar solvent, and a mixed solvent of two or more kinds thereof may be used.

Meanwhile, each step of the method for forming the nanopattern of one embodiment using the above described block copolymer will be described.

In the formation method of one embodiment, the above described block copolymer thin film is first formed on a substrate. At this time, the substrate may be a typical substrate such as silicon substrate or wafer, but it may be a typical substrate on which a specific lower film such as silicon oxide, etc. is formed.

Further, to form the block copolymer thin film, the block copolymer may be dissolved in an organic solvent to be applied onto the substrate. At this time, the block copolymer may have a number average molecular weight of about 5,000 to 200,000, and include about 10 to 90 wt % of the hard segments and about 90 to 10 wt % of the soft segments, as described above.

As the block copolymer satisfies the above molecular weight and the content range of each segment, a block copolymer thin film including a regular cylindrical or lamellar nanostructure may be preferably formed by solvent annealing or heat treatment of the block copolymer in the subsequent process. Further, the shape, size or spacing of the nanopattern can be properly controlled by controlling the molecular weight of the block copolymer or the content range of each segment, thereby easily forming a metal nanowire or metal nanomesh in a desired shape.

As the organic solvent to dissolve the block copolymer, one or more kinds of solvents selected from non-polar or polar solvents such as n-hexane, n-heptane, n-octane, cyclohexane, methylenechloride, 1,2-dichloroethane, chloroform, ethylether, benzene, chlorobenzene, dichlorobenzene, toluene, THF, acetone, dioxane, ethylacetate, DMF, DMAC, or DMSO may be used. The amount of the organic solvent may be about 10 time or more of the weight of the block copolymer.

To apply the organic solution of the block copolymer at a uniform thickness, a spin coater may be used to spin-coat the organic solution on a substrate, etc. thereby forming a thin film. At this time, the rotation number and time of the spin coater are important as well as the kind and concentration of the solvent, and considering this, the rotation number and time may be controlled to about 1000-5000 rpm and about 10-120 seconds, respectively.

Meanwhile, after applying the solution of the block copolymer to form the block copolymer thin film, a step of conducting orientation of the hard segments and the soft segments in a lamellar or cylindrical form by phase separation in the block copolymer thin film may be conducted. This orientation step may include, for example, the step of conducting solvent annealing of the block copolymer thin film or conducting heat treatment at a temperature higher than the melting point of the hard segment and the glass transition temperature of the soft segment.

For solvent annealing, the same organic solvent as used for dissolving the block copolymer may be used, but a mixed solvent of two or more kinds respectively selected from a non-polar solvent and a polar solvent may be preferably used. Further, the solvent annealing may be conducted at room temperature for about 4 to 96 hours. As the solvent annealing step is conducted under the above described conditions, more regular cylindrical or lamellar nanostructure of the soft segment may be formed on the block copolymer thin film.

According to the molecular weight of the block copolymer, each segment of the block copolymer may be oriented by heat-treatment of the thin film. At this time, the heat treatment may be conducted at a temperate higher than a melting point ($T_m$) of the repeating unit of Chemical Formula 1 constituting the hard segment and a glass transition temperature ($T_g$) of the repeating unit of Chemical Formula 2 constituting the soft segment for about 2 to 24 hours. By this method, a regular nanostructure may be formed on the thin film.

Furthermore, by controlling the conditions of the solvent annealing or heat treatment, the arrangement form of the cylindrical nanopattern may be controlled to various shapes such as a square shape, a hexagonal shape, etc., or the size, spacing or specific shape of the nanostructure having a lamellar or cylindrical form can be controlled. To uniformly arrange the nanopattern in a desired shape, size or spacing, the molecular weight of the block copolymer, or the chemical structure, molecular weight or compositional ratio of each segment may be appropriately controlled.

If the orientation step is conducted by the above described method, the hard segments and soft segments may be arranged in a lamellar or cylindrical form which is vertical to the substrate, and the cylindrical form is arranged in a square or hexagonal honeycomb shape in a top-down view of the substrate, so as to form a predetermined nanostructure on the block copolymer thin film. This nanostructure may have the shape, arrangement, size, spacing, etc., corresponding to the final desired metal nanowire or metal nanomesh.

After the above described orientation step, a step of adsorbing a material onto the thin film in which the material can be selectively adsorbed onto the hard segment may be conducted. The material that can be adsorbed onto the hard segment may be metal oxide, for example, an oxide of a transition metal such as Ru or Os. In a specific embodiment, the adsorption step of the material may be conducted by a method of treating the block copolymer thin film with a metal oxide solution (e.g., $RuO_4$ or $OsO_4$ solution) of about 0.05 to 1.0 wt %, or about 0.1 to 0.8 wt %, or about 0.1 to 0.6 wt %.

The hard segment nanostructure of the lamellar or cylindrical form may be properly controlled, depending on the polymer chain of the hard segments that remain after removal of the soft segments, and the reaction conditions to induce chemical reactions as well as the conditions such as the kind, treatment concentration or treatment time of the material adsorbed onto the hard segment. Therefore, by controlling the treatment conditions of the material, the reaction conditions, etc., it is possible to control the nanostructure of the hard segment in a desired shape, and also to more easily control and form a final metal nanowire or metal nanomesh having a desired shape and scale using the same.

After the above described orientation step and the optional adsorption step of the metal oxide, the step of selectively removing the soft segments from the thin film is conducted. To selectively remove the soft segments, UV may be irradiated to the block copolymer thin film. By UV irradiation, the soft segments are selectively decomposed, and subsequently, the UV-decomposed soft segments may be selectively removed by a deionized water washing process, etc. This washing step may be also conducted after the subsequent adsorption step of a metal precursor.

In the removal step of the soft segments, for example, UV of about 254 nm wavelength may be irradiated at about 5 to 50 Joule per unit area ($cm^2$) for about 1 to 60 minutes. Through this step, the soft segments are properly decomposed and removed by washing, etc.

As the UV irradiation process is conducted under the above described conditions, the soft segments are selectively removed from the block copolymer thin film to remain the hard segments, and therefore, the block copolymer thin film defined by a cylindrical or lamellar nanostructure may be formed.

At this time, the specific shape, size or spacing of the nanostructure formed on the block copolymer thin film can be controlled and/or partially modified by controlling UV treatment conditions for the thin film, the washing time, etc. This phenomenon is likely to be attributed to unique polymer chain structure and chemical reactivity of the hard segment of the block copolymer, in which these polymer chains cause a specific chemical reaction according to the specific conditions of soft segment-removing process. As a result, the nanostructure of the hard segment may be more easily controlled in a desired shape, and a final metal nanowire or metal nanomesh having a desired shape and scale can be more easily controlled and formed by using the same.

Meanwhile, after selectively removing the soft segments by the above described process, only the hard segments remain on the block copolymer thin film, and these hard segments may define the nanostructure of a cylindrical or lamellar form. In the formation method of one embodiment, therefore, a process of adsorbing a metal precursor onto the hard segment defining the nanostructure is conducted.

At this time, the metal precursor may be used in the form of a neutral metal salt aqueous solution. As described above, in the formation method of one embodiment, the neutral metal salt aqueous solution can be used as the metal precursor, instead of the acidic aqueous solution conventionally used, owing to use of the specific block copolymer. Therefore, the kind of the metal precursor and the metal component applicable to the formation method of one embodiment can be more diversified, and in particular, a silver metal nanowire or nanomesh which could not be formed by the conventional method using the block copolymer can be formed properly using a silver (Ag) precursor such as a neutral aqueous solution of silver (Ag) salt.

As such, in the formation method of one embodiment, a variety of metal nanowires or metal nanomeshes can be formed by using the more diverse metal precursors, and thus the metal precursor may include various metal precursors such as Pt, Pd, Co, Fe, Ni, Au, Ti, Cu, Ta, W, Ag, etc., or other various metal precursors. Further, the metal precursor may be aqueous solutions of metal salts which are obtained from cations of these metals. Examples of the metal salts may include $Na_2PtCl_4$, $Na_2PdCl_4$, $K_3Fe(CN)_6$, $K_3Co(CN)_6$, $KAg(CN)_2$, $CuCl_2 \cdot 6H_2O$, $HAuCl_4$, etc. and other various metal salts generally known.

When the hard segments are treated with the above described metal precursor, for example, the neutral metal salt aqueous solution, a metal derived therefrom binds with the repeating unit of Chemical Formula 1 of the hard segment to form a metal-polymer complex. Therefore, the metal components are formed according to the cylindrical or lamellar nanostructure of the hard segment, and in the subsequent process, a metal nanowire or metal nanomesh may be formed by removing the hard segments.

Meanwhile, after adsorption of the metal precursor, a final metal nanowire or metal nanomesh may be formed by removing the hard segments. The process of removing the hard segments may be conducted, for example, by treating the thin film including the hard segments with oxygen plasma. As such, when the hard segments are removed, only the metal components adsorbed and formed according to the nanostructure of the hard segments remain to form the metal nanowire or metal nanomesh.

At this time, the oxygen plasma may be treated under conditions of, for example, about 20~60 sccm and about 20~100 W, for about 1 minute to 10 minutes, in order to properly remove the hard segments.

The shape, size, or spacing of the metal nanowires or metal nanomeshes finally formed in one embodiment can be also easily controlled, depending on the conditions of the oxygen plasma treatment process, etc.

Meanwhile, as described above, when the hard segments are removed by oxygen plasma treatment after adsorption of the metal precursor, a metal nanowire or metal nanomesh including the reduced form of the metal may be formed. According to circumstances, at least a part of the metal oxide may be included in the metal nanowire or metal nanomesh thus formed. Referring to Examples described below and FIG. 7, it was confirmed that when the hard segments are removed after adsorption of a gold (Au) precursor, a nanowire or nanomesh including pure gold (Au) in a reduced form may be directly formed, which is likely to be attributed to excellent stability of gold (Au). In contrast, when the hard segments are removed by oxygen plasma after adsorption of other metal precursor such as Pt, Fe, Co, Ag, etc., at least a part of the metal oxide may be included in the nanowire or nanomesh.

As such, when a part of the metal oxide is formed, a process of reducing the metal oxide in the presence of hydrogen gas under an inert atmosphere such as nitrogen may be further conducted. By the reduction process, a metal nanowire or metal nanomesh composed of the pure metal in the reduced form may be formed. The specific conditions for the reduction process may vary depending on the type of metal or metal oxide, which are apparently known to those skilled in the art. In general, the reduction process may be conducted at a temperature of about 200 to 500° C. for about 1 minute to 10 minutes. For reference, the present inventors obtained a pure silver (Ag) nanowire and nanomesh after the reduction process of a nanowire or nanomesh including silver (Ag) oxide (e.g., $Ag_2O$). This nanowire and nanomesh was composed of pure silver (Ag), which can be demonstrated from, for example, the results of XPS analysis in the lower right panel of FIG. 7.

The metal nanowire or metal nanomesh formed by the above described method of one embodiment may be in the form, for example, in which a plurality of nanowires having a line width of about 5 to 50 nm are formed on the substrate at a spacing of about 5 to 100 nm, or a plurality of nanomeshes having a diameter of about 5 to 70 nm are formed on the substrate at a spacing of about 5 to 100 nm.

As used herein, the term "line width" of the nanowire means the shortest distance among the straight lines in a width direction between any two points on the surface of one nanowire in a width direction perpendicular to the length direction of one nanowire, and the term "diameter" of the nanomesh means the longest distance among the straight lines between any two points on the surface of one nanomesh in a direction horizontal to the substrate. Further, the term "spacing (or pitch)" means the shortest distance among the distances between contiguous nanowires or nanomeshes.

These metal nanowires or metal nanomeshes can be preferably applied to a variety of optical devices, optical waveguides, chemical sensors, biosensors, magnetic storage media, next-generation devices or transparent electrodes, etc.

Advantageous Effects

According to the present invention, as described above, a metal nanowire or metal nanomesh can be formed in a desired shape using more diverse metals including Ag. Moreover, a process of removing hard segments after adsorption of a specific metal precursor onto the hard segments of a block copolymer is only conducted to form the metal nanowire or metal nanomesh, without an additional chemical or physical treatment process such as surface treatment, middle layer coating, metal deposition, etc.

According to the present invention, therefore, a variety of metal nanowires or metal nanomeshes can be formed in a desired shape by a simplified method, and they can be applied to an optical device, a biosensor, a magnetic storage medium, or a next-generation device or an electrode, etc.

BRIEF DESCRIPTION OF DRAWINGS

FIG. 1a is an SEM photograph of the surface of a lamellar-shaped nanostructure, after removal of soft segments which were decomposed by UV irradiation of the lamellar-shaped nanostructure formed on the surface of a polymer thin film in Example 5;

FIG. 1b is an SEM photograph of the surface and cross section of a Pt metal nanowire finally formed in Example 5;

FIG. 2 is an SEM photograph of the surface and cross section of a Fe metal nanowire finally formed in Example 6;

FIG. 3 is an SEM photograph of the surface and cross section of a Co metal nanowire finally formed in Example 6;

FIG. 4 is an SEM photograph of the surface and cross section of an Ag metal nanowire finally formed in Example 6;

FIG. 5 is an SEM photograph of the surface and cross section of an Au metal nanowire finally formed in Example 6;

FIG. 6a is an SEM photograph of the surface of a cylindrical nanostructure, after removal of soft segments which were decomposed by UV irradiation of the cylindrical nanostructure arranged in a hexagonal shape on the surface of a polymer thin film in Example 7;

FIG. 6b is an SEM photograph of the surface and cross section of a Pt metal nanowire finally formed in Example 7;

FIG. 6c is an SEM photograph of the surface of a Fe metal nanomesh finally formed in Example 8;

FIG. 6d is an SEM photograph of the surface of a Co metal nanomesh finally formed in Example 8;

FIG. 6e is an SEM photograph of the surface of an Ag metal nanomesh finally formed in Example 8; and FIG. 7 is XPS analysis data of the binding energy of various metal nanowires prepared in Examples 5 and 6.

EXAMPLES

Hereinafter, the function and effect of the present invention will be described in more detail with reference to the specific Examples of the present invention. However, these Examples are only to illustrate the invention and are not intended to limit the scope of the invention.

Examples 1 to 4: Preparation of Macroinitiator and Block Copolymer

[Example 1]: Preparation of Macroinitiator (Macro-PMMA)-1

6.0 g of monomers MMA, 66.3 mg of a RAFT reagent cyanoisopropyldithiobenzoate, 24.6 mg of a radical initiator AIBN, and 6.82 mL of benzene were poured into a 20 mL-glass ampoule, and oxygen was removed from the solution by freeze-thawing, and then the ampoule was sealed, and RAFT polymerization was conducted in an oil container of 60° C. for 24 hours. After polymerization, the reaction solution was precipitated in 200 mL of an extraction solvent methanol, filtered under reduced pressure, and dried to prepare a pink macroinitiator (Macro-PMMA)-1 in which the RAFT reagent is bound to both ends of MMA (PMMA) polymer. The polymerization conversion, number average molecular weight ($M_n$), molecular weight distribution ($M_w/M_n$) and glass transition temperature ($T_g$) were 95%, 19700, 1.14 and 119° C., respectively.

[Example 2]: Preparation of Novel Block Copolymer-1

0.732 g of the acrylamide-based monomer DOPAM synthesized in Example 1 of Korean Patent NO. 1163659, 0.45 g of the macroinitiator-1 prepared in Example 1, 2.54 mg of AIBN, and 3.794 mL of benzene were poured into a 10 mL Schlenk flask, stirred at room temperature for 30 minutes under nitrogen atmosphere, and then RAFT polymerization was conducted at a silicon oil container of 70° C. for 72 hours. The polymer solution was precipitated in 200 mL of methanol, and then filtered under reduced pressure, and dried to prepare a light yellow block copolymer-1 (PMMA-b-PDOPAM-1). The composition ratio of the hard segment vs. the soft segment in the block copolymer-1 (ratio of number average molecular weight measured by GPC) was 47 wt % vs. 53 wt %. The polymerization conversion, number average molecular weight, molecular weight distribution, $T_g$ and melting temperature ($T_m$) were 55%, 37000, 1.25, 119° C., 235° C., respectively.

[Example 3]: Preparation of Macroinitiator (Macro-PMMA)-2

A pink macroinitiator (Macro-PMMA)-2 was prepared in the same manner as in Example 1, except that 4.085 g of the monomer MMA, 90.3 mg of a RAFT reagent cyanoisopropyldithiobenzoate, 33.5 mg of a radical initiator AIBN, and 4.684 mL of benzene were used. The polymerization conversion, number average molecular weight ($M_n$), molecular weight distribution ($M_w/M_n$) and glass transition temperature ($T_g$) were 90%, 10800, 1.15 and 119° C., respectively.

[Example 4]: Preparation of Novel Block Copolymer-2

A novel light yellow block copolymer-2 (PMMA-b-PDOPAM-2) was prepared in the same manner as in Example 2, except that 0.774 g of the acrylamide-based monomer DOPAM synthesized in Example 1 of Korean Patent NO. 1163659, 0.3 g of the macroinitator-2 prepared in Example 3, 3.0 mg of AIBN, and 4.011 mL of benzene were used. The composition ratio of the hard segment vs. the soft segment in the block copolymer-2 (ratio of number average molecular weight measured by GPC) was 66 wt % vs. 34 wt %. The polymerization conversion, number average molecular weight, molecular weight distribution, $T_g$ and $T_m$ were 66%, 29400, 1.30, 119° C., 235° C., respectively.

Example 5 to 6: Formation and Identification of Various Metal Nanowires

[Example 5]: Formation of Pt Metal Nanowire Using Block Copolymer-1

The block copolymer-1 (PMMA-b-PDOPAM-1) prepared in Example 2 was dissolved in a chloroform solvent to prepare a 0.5 wt % solution thereof, which was then coated on a substrate of a silicon wafer, in which $SiO_2$ was applied on the surface thereof, at 3000 rpm for 60 seconds using a spin coater to form a thin film. The block copolymer thin film thus prepared was put in a desiccator that was maintained under atmosphere of the stream of a mixed solvent of THF/cyclohexane 8/2 (v/v, volume ratio), and aged for 24 hours to manifest a lamellar nanostructure on the surface of the thin film.

The thin film having the lamellar nanostructure was put in a vial containing 0.4 wt % $RuO_4$ liquid for 4 minutes to adsorb $RuO_4$ on the thin film, and then irradiated with UV at 254 nm for 15 minutes to decompose the soft segments (PMMA). Subsequently, the film was put in 3 mL of 20 mM $Na_2PtCl_4$ aqueous solution for 3 hours, and then taken out and washed with water several times to remove the decomposed soft segments, and then dried to prepare a thin film in which Pt metals were adsorbed onto the hard segments (PDOPAM). This film was treated with oxygen plasma (40 sccm; 50 W; 60 sec) to form a lamellar Pt metal nanowire.

FIG. 1a is an SEM photograph of the surface of a lamellar nanostructure, after removal of soft segments which were decomposed by UV irradiation of the lamellar nanostructure formed on the surface of a polymer thin film. FIG. 1b is an SEM photograph of the surface and cross section of a Pt metal nanowire which was formed by removing hard segments by oxygen plasma treatment, after selective adsorption of Pt metal ions onto the hard segments in the lamellar nanostructure of FIG. 1a. Referring to FIGS. 1a and 1b, it was confirmed that the Pt metal nanowires are well-arranged on a silicon substrate having a wide area (4×3 μm). The line width and spacing of the Pt metal nanowires were about 20 nm and about 39 nm, respectively.

[Example 6]: Formation of Various Metal Nanowires Using Block Copolymer-1

Various lamellar metal nanowires of Fe, Co, Ag, or Au were formed in the same manner as in Example 5, except that a $K_3Fe(CN)_6$, $K_3Co(CN)_6$, $KAg(CN)_2$, or $HAuCl_4$ aqueous solution was used as a metal precursor, instead of $Na_2PtCl_4$ aqueous solution. The surface and cross section of the Fe, Co, Ag, or Au metal nanowire were analyzed by SEM, and photographs thereof are shown in FIGS. 2 to 5. Referring to FIGS. 2 to 5, it was confirmed that the metal nanowires were well-arranged on a silicon substrate having a wide area (4×3 μm).

At this time, the metal nanowires composed of the metals were identified by measuring their own binding energy of the various metals by XPS (X-ray Photoelectron Spectroscopy). FIG. 7 is analysis data of the binding energy of various metal nanowires prepared in Examples 5 and 6. As a result, it was confirmed that the metal nanowires were well-prepared.

Example 7 to 8: Formation and Identification of Various Metal Nanomeshes

[Example 7]: Formation of Pt Metal Nanomesh Using Block Copolymer-2

The block copolymer-2 (PMMA-b-PDOPAM-2) prepared in Example 4 was dissolved in a chloroform solvent to prepare a 0.5 wt % solution thereof, which was then coated on a substrate of a silicon wafer, in which $SiO_2$ was applied on the surface thereof, at 3000 rpm for 60 seconds using a spin coater to form a thin film. The block copolymer thin film thus prepared was put in a desiccator that was maintained under atmosphere of the stream of a mixed solvent of THF/cyclohexane 8/2 (v/v, volume ratio), and aged for 24 hours to manifest a cylindrical nanostructure arranged in a hexagonal shape on the surface of the thin film.

The thin film having the cylindrical nanostructure was put in a vial containing 0.4 wt % $RuO_4$ liquid for 4 minutes to adsorb $RuO_4$ on the thin film, and then irradiated with UV at 254 nm for 15 minutes to decompose the soft segments (PMMA). Subsequently, the film was put in 3 mL of 20 mM $Na_2PtCl_4$ aqueous solution for 3 hours, and then taken out and washed with water several times to remove the decomposed soft segments, and then dried to prepare a thin film in which Pt metals were adsorbed onto the hard segments (PDOPAM). This film was treated with oxygen plasma (40 sccm; 50 W; 60 sec) to form a honeycomb-shaped Pt metal nanomesh.

FIG. 6a is an SEM photograph of the surface of a cylindrical nanostructure, after removal of soft segments which were decomposed by UV irradiation of the cylindrical nanostructure formed on the surface of a polymer thin film. Referring to FIG. 6a, it was confirmed that black nanomesh patterns from which soft segments were selectively removed were well-arranged in a two-dimensional hexagonal honeycomb shape. It was also confirmed that the diameter of each nanopattern of the cylindrical shape and the spacing (pitch) were about 15 nm and about 30 nm, respectively. FIG. 6b is an SEM photograph of the surface of a Pt metal nanomesh which was formed by removing hard segments by oxygen plasma treatment after selective adsorption of Pt metal ions onto the hard segments in the cylindrical nanostructure of FIG. 6a. It was confirmed that the diameter and spacing of the Pt metal nanomesh were about 19 nm and about 31 nm, respectively. Further, the above described XPS analysis technique was performed to confirm that large honeycomb-shaped Pt metal nanomeshes were well-formed. The results are the same as in FIG. 7.

[Example 8]: Formation of Various Metal Nanomeshes Using Block Copolymer-2

Various metal nanomeshes of Fe, Co or Ag were formed in the same manner as in Example 7, except that a 30 mM $K_3Fe(CN)_6$, $K_3Co(CN)_6$, or $KAg(CN)_2$ aqueous solution was used as a metal precursor, instead of $Na_2PtCl_4$ aqueous solution. The surface of the Fe (diameter=about 15 nm; spacing=about 31 nm), Co (diameter=about 15 nm; spacing=about 31 nm) or Ag (diameter=about 19 nm; spacing=about 31 nm) metal nanomesh was analyzed by SEM, and photographs thereof are shown in FIGS. 6c to 6e. Referring to FIGS. 6c to 6e, it was confirmed that the honeycomb-shaped metal nanomeshes were well-arranged on a silicon substrate having a wide area (4×3 μm).

Further, the above described XPS analysis technique was performed to confirm that a variety of large honeycomb-shaped metal nanomeshes were well-formed. The results are the same as in FIG. 7.

The invention claimed is:

1. A method for forming a metal nanowire or a metal nanomesh, comprising the steps of:
forming a block copolymer thin film on a substrate, in which the block copolymer thin film includes hard segments containing a repeating unit of Chemical Formula 1 and soft segments containing a poly(meth)acrylate-based repeating unit of Chemical Formula 2;
conducting orientation of the hard segments and soft segments in a lamellar or cylindrical form in the block copolymer thin film;
adsorbing an oxide of a transition metal onto the block copolymer thin film, in which the oxide of a transition metal is selectively adsorbed onto the hard segments;
selectively removing the soft segments;
adsorbing a metal precursor onto the hard segments; and
removing the hard segments and forming the metal nanowire or the metal nanomesh, by treating the hard segments with oxygen plasma:

[Chemical Formula 1]

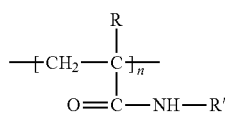

[Chemical Formula 2]

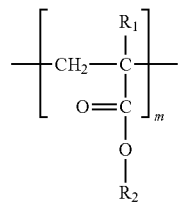

in Chemical Formula 1, n is an integer of 5 to 600, R is hydrogen or methyl, R' is X,

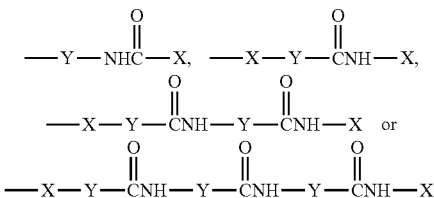

X is —Z—R", Y is alkylene having 1 to 10 carbon atoms, Z is arylene having 6 to 20 carbon atoms, R" is a linear or branched hydrocarbon having 10 to 20 carbon atoms, or a linear or branched perfluorohydrocarbon having 10 to 20 carbon atoms, in Chemical Formula 2, m is an integer of 30 to 1000, $R_1$ and $R_2$ are methyl, wherein the step of adsorbing an oxide of a transition metal onto the block copolymer thin film, the block copolymer thin film is treated with a solution including 0.05 to 1.0 wt % of $RuO_4$ or $OsO_4$, wherein the hard segment is a crystalline hard segment, wherein the crystalline hard segment and the block copolymer including the same has a melting point (Tm) of 200 to 300° C., and the soft segment has a glass transition temperature (Tg) of 40 to 130° C., and wherein the step of conducting orientation includes a step of conducting solvent annealing of the block copolymer thin film or conducting heat treatment at a temperature higher than the melting point of the hard segment and the glass transition temperature of the soft segment.

2. The method of claim 1, wherein the block copolymer includes 10 to 90 wt % of the hard segment and 90 to 10 wt % of the soft segment.

3. The method of claim 1, wherein a plurality of nanowires having a line width of 5 to 50 nm are formed at a spacing of 5 to 100 nm.

4. The method of claim 1, wherein a plurality of nanomeshes having a diameter of 5 to 70 nm are formed at a spacing of 5 to 100 nm.

5. The method of claim 1, wherein by the orientation step, the hard segments and soft segments are arranged in a lamellar or cylindrical form which is vertical to the substrate, and the cylindrical form is arranged in a square or hexagonal honeycomb shape in a top-down view of the substrate.

6. The method of claim 1, wherein the step of selectively removing the soft segments includes a step of UV irradiation of the block copolymer thin film.

7. The method of claim 1, wherein the metal precursor is used in the form of a neutral metal salt aqueous solution.

8. The method of claim 7, wherein the neutral metal salt includes $Na_2PtCl_4$, $Na_2PdCl_4$, $K_3Fe(CN)_6$, $K_3Co(CN)_6$, $KAg(CN)_2$, $CuCl_2 \cdot 6H_2O$ or $HAuCl_4$.

9. The method of claim 1, wherein the metal precursor is prepared from a cation of a metal selected from the group consisting of Pt, Pd, Co, Fe, Ni, Au, Ti, Cu, Ta, W and Ag.

* * * * *